(12) United States Patent
Lai et al.

(10) Patent No.: US 6,292,521 B1
(45) Date of Patent: Sep. 18, 2001

(54) PHASE LOCK DEVICE AND METHOD

(75) Inventors: Jiin Lai, Cupertino, CA (US); Hsin-Chieh Lin; Fang-Yi Chen, both of Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/150,365

(22) Filed: Sep. 9, 1998

(30) Foreign Application Priority Data

Oct. 20, 1997 (TW) .................................................. 86115460

(51) Int. Cl.$^7$ ........................................................ H04L 7/00
(52) U.S. Cl. ............................ 375/357; 375/373; 327/161; 327/163
(58) Field of Search .................................. 375/354, 357, 375/371, 373, 375, 376; 327/154, 160, 161, 162, 163

(56) References Cited

U.S. PATENT DOCUMENTS

| | | | |
|---|---|---|---|
| 5,161,175 | * | 11/1992 | Parket et al. . |
| 5,327,103 | * | 7/1994 | Baron et al. . |
| 5,343,503 | * | 8/1994 | Goodrich . |
| 5,629,897 | * | 5/1997 | Iwamoto et al. . |
| 5,905,391 | * | 5/1999 | Mooney .............................. 327/161 |
| 6,121,815 | * | 9/2000 | Terada et al. ........................ 327/292 |

* cited by examiner

Primary Examiner—Amanda T. Le
(74) Attorney, Agent, or Firm—Michael Best & Friedric LLC; J. Warren Whitesel

(57) ABSTRACT

A phase lock device and method applicable to a data transmission system, particularly to a high speed transmission system are provided. Based on that the optimum operation margin for delaying data strobe is to shift the edge of data strobe to the middle region of data signal, the phase lock device and method suggest a solution, by analyzing the influence of environmental and operational conditions on delaying data strobe and system clock, to adapt delay element to the variation of environmental and operational conditions, so that the delay of data strobe is always in such a range that the data receiver can be enabled to do accurate and reliable data reading, regardless of external interference.

17 Claims, 6 Drawing Sheets

PHASE LOCK DEVICE AND METHOD

FIELD OF THE INVENTION

The present invention relates to a method and device applicable to a data transmission system, for dynamically adapting a data strobe to environments so that the phase (determined by some factors such as time delay, and influence of environment) of the data strobe is always proper for data receiver to read the data transmitted together with the data strobe from a data sender.

BACKGROUND OF THE INVENTION

Not being subject to the critical requirement for transmission speed, the conventional transmission systems were controlled simply according to clock pulses, and might take up to 10 ns for transmitting a piece of data, as can be seen from FIG. 1.

With the growing demand for higher transmission speed, the feasibility to improve a conventional transmission system is seriously confined by the time delay problem inherent in the clock pulses of the system. As can be seen from FIG. 2 in which a transmission system has its data sent out from a data sender according to clock pulses, there's a time delay such as 2–3 ns for the same clock pulse between the sender site and the receiver site, due to the delay inherent in the buffers of both sender and receiver ($T_{output\ buffer}$), the transmission line ($T_{flight\ time}$), and the clock skew ($T_{clock\ skew}$). Total delay time=$(T_{output\ buffer})+(T_{flight\ time})+(T_{clock\ skew})$. To assure correct receiving of data under the condition of the existence of the clock pulse delay, there's a need to extend the time period of holding data. With the clock pulse delay, another problem is the limit on the transmission speed of a transmission system due to the difficulty of increasing the frequency of the clock pulses.

Data Strobe is thus adopted to solve the above problem of clock pulse delay, for effectively promoting transmission speed. As shown in FIG. 3, Data Strobe have been used to function as clock pulses, and data signal is transmitted and received together with Data Strobe, in order to eliminate the effects of ($T_{output\ buffer}$) and ($T_{flight\ time}$), and to enable double data reading (DDR), so that the data can be read in response to both the rising and falling edges of the Data Strobe. Without taking into account the skew of Data Strobe, maximum transmission speed is limited only by the setup time and hold time of the flip-flops at both sender and receiver, and hence may approximate to 1 ns (setup time of 0.5 ns and hold time of 0.5 ns).

It is based on the synchronous transmission of both data signal and Data Strobe at the sender, that the Data Strobe is applied to communication industry. That's, the sender transmits both data signal and Data Strobe at the same time in response to the rising or falling edge of the clock pulse, so that ($T_{output\ buffer}$) and ($T_{flight\ time}$) can be balanced through the effect of the same delay trace, and the skew between data signal and Data Strobe can be minimized. The timing chart for sender is shown in FIG. 4. Because the data signal must be read with the rising or falling of Data Strobe at receiver, there shall be proper delay for the edge of Data Strobe at receiver to assure reliable reading of data signal, as can be seen from FIG. 5. Therefore a delay element must be installed at the receiver of the fundamental system shown in FIG. 3, to delay the Data Strobe at the receiver, as shown in FIG. 6.

The design of the above delay element for delaying the Data Strobe at the receiver shown in FIG. 6 is difficult, because an improper delay provided by the delay element may lead to incorrect reading of data at receiver. Now it can be realized that the reliable or correct reading of data at receiver depends on the proper delay period ($D_{ds-da}$) between the data signal and the Data Strobe at the receiver, i.e., it depends on if the phase of Data Strobe at the receiver is within a stable margin in which the receiver can always be enabled to do correct reading of data.

The above delay period ($D_{ds-da}$) may be determined by the following factors:

1. the skew (ps) inherent in the transmission of both the data signal and the Data Strobe sent from data sender to data receiver.
2. the delay (sd) arising from the operation of delay elements.

Obviously $D_{ds-da}$=ps+sd. Among those affecting ps are the differences between output buffers, between PCB layouts, between receiver buffer threshold, between setup/hold time of flip-flops, and another factors. Among those affecting sd are delay element design, and influence of temperature, humidity, voltage, variation of frequency, or electromagnetic interference, and so on. Under the dynamic influence of various factors, the delay period is very unstable, possibly with a variation up to 0.5–1.8 ns for an example with system frequency of 66 Mhz. Further the variation is different for different system frequencies such as 66 Mhz, 75 Mhz, 83 Mhz, 100 Mhz, 133 Mhz, . . . . and so on. As system frequency gets higher, Clock pulse gets narrower, and the tolerable error margin of the skew for the system gets critically smaller. It has called significant attention to answer an question of how much the Data Strobe shall be delayed. Either too long or too short delay of the Data Strobe may lead to incorrect reading of data at receiver, or even system down.

Even an optimum delay has been calculated, the varying of ps and sd with temperature, voltage, frequency, electromagnetic interference, . . . , and so on may force the calculated optimum delay out of the best margin. This is why a conventional transmission system is often subject to the problem of data loss or system failure.

Now it is clearly the keys to the above problem are:

1. how to estimate the proper delay for the Data Strobe at receiver to assure the correct reading of data at receiver?
2. how to design delay elements in such a way that it can minimize the effect resulting from the variation of temperature, voltage, frequency, and the electromagnetic interference, . . . , and so on, in order to assure reliable reading of data, and system stability?

In spite of their relevant disclosures, the prior arts such as U.S. Pat. Nos. 5327103, 5161175, 5629897, 5343503 haven't suggested effective solutions.

SUMMARY OF THE INVENTION

Therefore the present invention is thus suggested to provide a method and device functioning as the above keys, whereby not only a target delay for Data Strobe can be forecast, but also an optimum delay can be achieved through dynamically adjusting the delay of the Data Strobe.

The objects of the present invention:

1. to achieve a high speed data transmission system with reliable and accurate data reading operation which can be immune from environmental influence.
2. to realize a phase locking by analyzing system clock to adapt reference clock (such as Data Strobe) to environmental influence.

3. to suggest an operation mode as a basis for DDR (double data reading).
4. to suggest a method, based on phase shifting, for accurate and reliable data reading at receiver.
5. to disclose a method for estimating an optimum delay of Data Strobe, and for automatically adapting the system to frequency variation, so that an optimum margin for reliable data reading operation can be realized.

An embodiment of the present invention may be characterized as follows: a delay element with adjustable delay period is set to delay the Data Strobe for a target delay value, several elements identical to the delay element are serially connected to delay the system clock for an auxiliary delay value, a monitoring device is configured to detect the variation of the auxiliary delay value which responds to varying environmental and operational conditions, and to calculate how to adjust (how much longer or how much shorter) these delay elements (the one for delaying Data Strobe and those for delaying system clock), keeping on the adjustment based on the detected variation of the auxiliary delay value will lead to that the delay period of the Data Strobe is always in such a margin that the data receiver is enabled to do data reading accurately and reliably. It shall be understood the variation of the auxiliary delay value can be detected by comparing the original system clock and the delayed system clock to find the phase difference between them. The phase difference represents the variation of the auxiliary delay value, which results from the delay element's response (serially connected delay elements' response, obviously also implying the response of the single delay element for delaying the data strobe) to environmental and operational conditions' variation. It can be seen now the variation of the delay (difference between actual delay and the target delay value, for example) provided by the delay element for the data strobe can be minimized by generating, based on the detected phase difference, a control signal to adjust all the delay elements. It must be noted, not only the single delay element for delaying the data strobe but also the serially connected delay elements for delaying the system clock shall be adjusted according to the same control single, so that the detected phase difference reflects the influence of varying environmental and operational conditions on not only the auxiliary delay value (provided by the serially connected delay elements) but also the actual delay of the data strobe, and therefore the control signal generated according to the phase difference can be proper for adjusting the actual delay of the data strobe. It shall be understood a good way to detect, based on the phase difference between the original system clock and the delayed system clock, the variation of the auxiliary delay value resulting from varying environmental and operational conditions is to configure the system in such a way that the auxiliary delay value is in the range of about one clock period of the system clock, so that a straightforward comparing of either rising edge or falling edge between the original system clock and the delayed system clock is all that to be done for analyzing the influence of varying environmental and operational conditions on the delay period to properly adjust the delay elements.

The present invention may be embodied as a phase lock circuit for dynamically delaying a data strobe signal which is transmitted, according to a system clock, together with a data signal, from a data sender to a data receiver, the phase lock circuit may comprise:

a strobe delay element for delaying the data strobe signal for a first delay period according to a control signal inputted to a strobe delay control pin thereof (the delay period produced by the strobe delay element is hereinafter called "first delay period", its length is determined by the strobe delay element according to the control signal);

a delay array for delaying the system clock for a second delay period according to the control signal applied thereto (the delay period produced by the delay array is hereinafter called "second delay period", its length is determined by the delay array according to the control signal); and a comparator for detecting the second delay period, and for generating, according to the second delay period, the control signal to be inputted to both the strobe delay control pin and the system clock delay control pin. The comparator receives the delayed system clock from delay array and the original system clock applied thereto, and detecting the second delay period by analyzing the phase difference between the delayed system clock and the original system clock, to generate, according to the second delay period, the control signal to be applied to both the strobe delay element and delay array, whereby the second delay period or the phase difference, which reflects the influence of the variation of environmental and operational conditions on the delay array consisting of serially connected delay elements each identical to the strobe delay element, can be used to determine what kind of control signal shall be generated to adapt the strobe delay element to the variation of environmental and operational conditions so that the delay of data strobe at receiver is always in such a margin that the data strobe can enable data receiver to read data accurately and reliably.

The above comparator may comprise a counter for generating the control signal according to the second delay period.

Obviously the above counter may be configured to generate the control signal according to the difference (implying the deviation of the second delay period form a target value) between a preset value and the second delay period, i.e., to calculate, based on the difference, to what extent the strobe delay element shall be adjusted, so that the control signal can be generated according to the calculation.

The phase lock circuit is configured in such a way that when the second delay period is bigger than the preset value, both the first delay period and the second delay period are reduced according to the control signal, and when the second delay period is smaller than the preset value, both the first delay period and the second delay period are increased according to the control signal.

The above data array comprises a group of serially connected clock delay elements each delaying the system clock for the first delay period according to the control signal, whereby the second delay period is approximately equal to the sum of all the first delay periods.

The number of the serially connected clock delay elements in the above phase lock circuit is selected in such a way that when the preset value is equal to a clock period of the system clock, the control signal will be at a level leading to that the second delay period is approximately equal to the clock period of the system clock.

The number of the serially connected clock delay elements in the above phase lock circuit is selected to be four, and when the preset value is equal to a clock period of the system clock, the control signal will be at a level leading to that the first delay period is approximately equal to one quarter of the clock period.

The phase lock circuit had better be installed beside the receiver, whereby the resultant optimum Data Strobe can best fit the reading operation at receiver.

Obviously the phase lock circuit may be so configured (proper selection of the number of the serially connected clock delay elements and the preset value, or proper generation of the control signal, for example) that when the second delay period is approximately equal to the preset value, the first delay period, adjusted by the control signal, is in such a margin (middle region of the data signal, for example) that the data strobe signal enables the data receiver to always read the data signal correctly and reliably.

The present invention may also be embodied as a phase lock method for dynamically delaying, using a data strobe delay element with adjustable delay period (the length of the delay period can be adjusted, for example, according to a control signal applied to the data strobe delay element), a data strobe signal which is transmitted together with a data signal, according to a system clock, from a data sender to a data receiver, the phase lock method comprises the steps of:

- adjusting the data strobe delay element to delay the data strobe signal for a first delay period;
- obtaining a delayed system clock by repetitively delaying (using an auxiliary delay element which is identical to the data strobe delay element, for example) the system clock N times each for the first delay period;
- detecting the clock difference between the delayed system clock and the system clock;
- if clock difference is bigger than a preset value, adjusting the data strobe delay element to delay the data strobe signal for a second delay period which is shorter than the first delay period, and adjusting the auxiliary delay element to repetitively delay the system clock N times each for the second delay period;
- if the clock difference is smaller than the preset value, adjusting the data strobe delay element to delay the data strobe signal for a third delay period which is longer than the first delay period, and adjusting the auxiliary delay element to repetitively delay the system clock N times each for the third delay period.

The above phase lock method may be such that the data strobe delay element is adjusted to delay the data strobe signal for the first delay period which is approximately one quarter of a clock period of the system clock. The preset value is equal to the clock period, and the N is selected to be four.

The above phase lock method may also be such that the data strobe delay element is adjusted to delay the data strobe signal for the first delay period which is approximately half of a clock period of the system clock. The preset value is equal to the clock period, and the N is selected to be two.

The above phase lock method may be so arranged (proper selection of the number N and the preset value, for example) that when the clock difference is approximately equal to the preset value. The first delay period is in such a margin that the data strobe signal enables the data receiver to always read the data signal correctly and reliably.

Obviously the above phase lock method may also be so arranged that when the clock difference is within a range, the first delay period is always in such a margin that the data strobe signal enables the data receiver to read the data signal reliably and correctly.

The present invention may best be understood through the following description with reference to the accompanying drawings, in which:

DETAILED DESCRIPTION OF THE PREFERRED EMBODIMENTS

Figure 1:
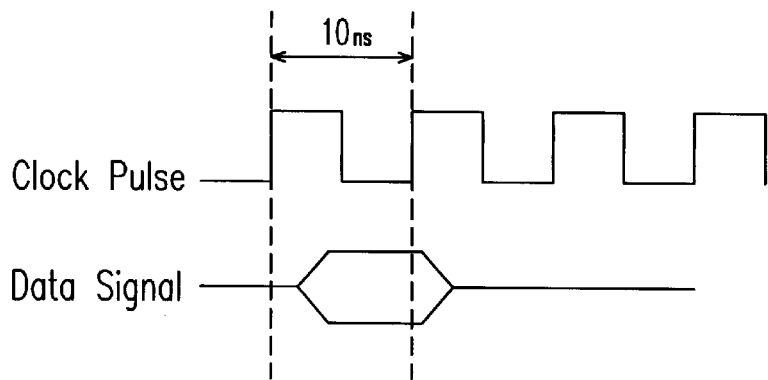
FIG. 1 is a diagram showing a timing chart for synchronous data reading according to clock pulse.
Figure 2:
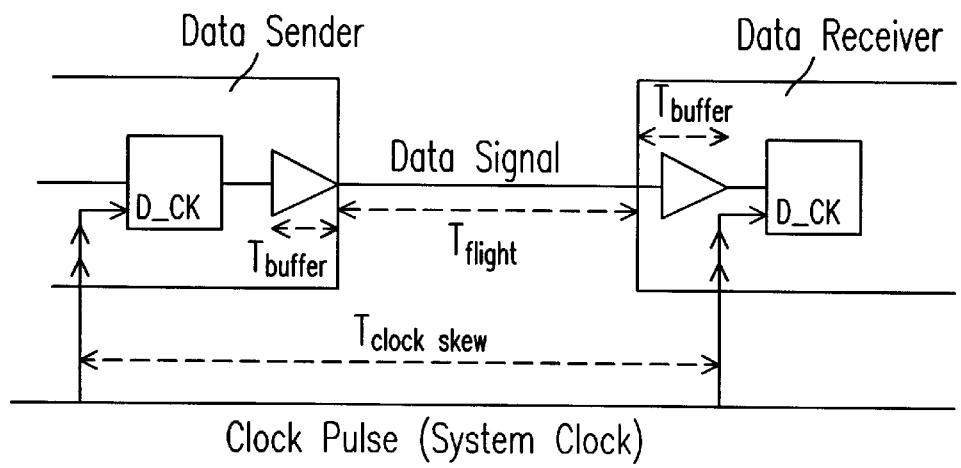
FIG. 2 shows a hardware structure of a data sender and receiver reading data according to a clock pulse.
Figure 3:
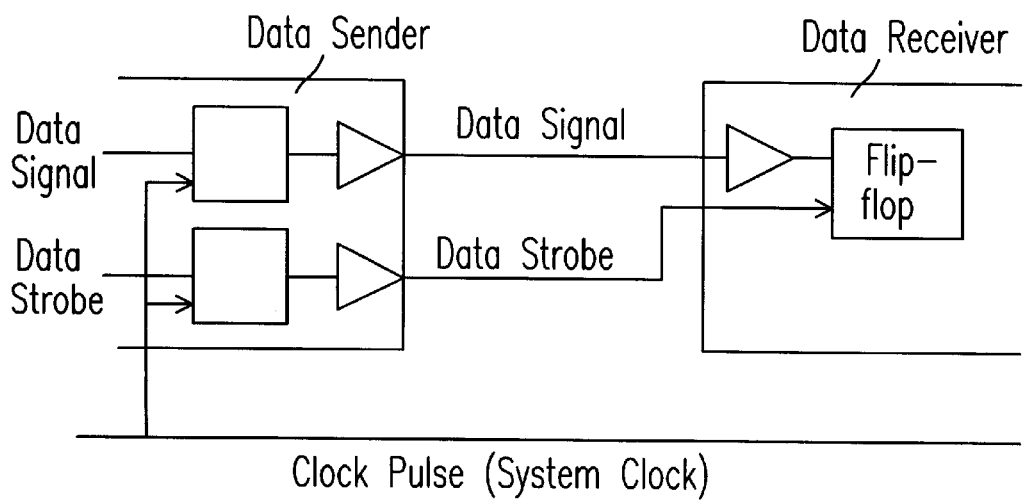
FIG. 3 shows a hardware structure of a data sender and receiver reading data according to data strobe instead of clock pulse.
Figure 4:
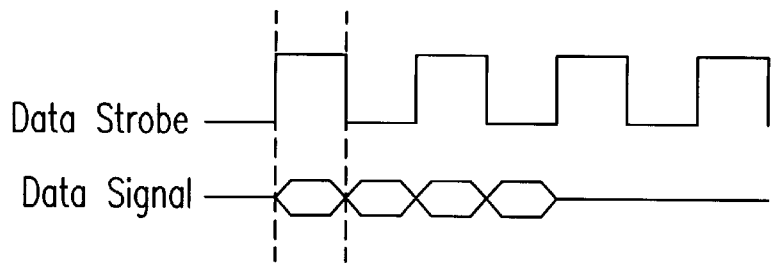
FIG. 4 shows a time chart for data strobe and data signal when using data strobe to control data reading.
Figure 5:
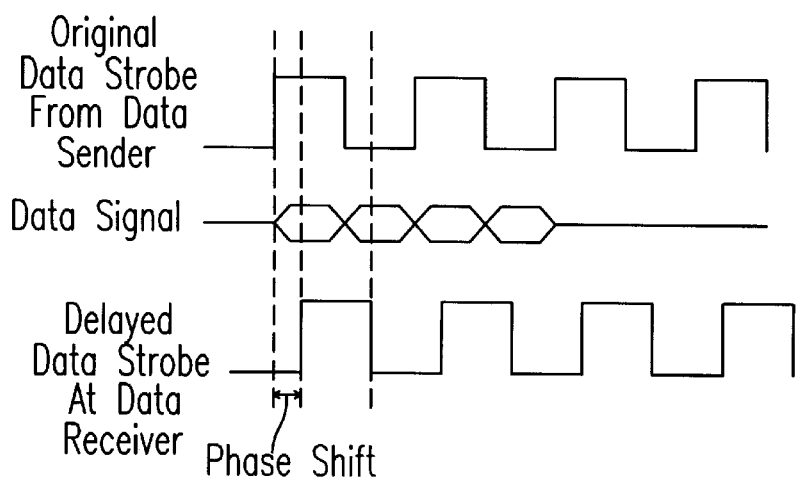
FIG. 5 illustrates the edge difference between the data strobe transmitted from data sender and the delayed data strobe at receiver.
Figure 6:
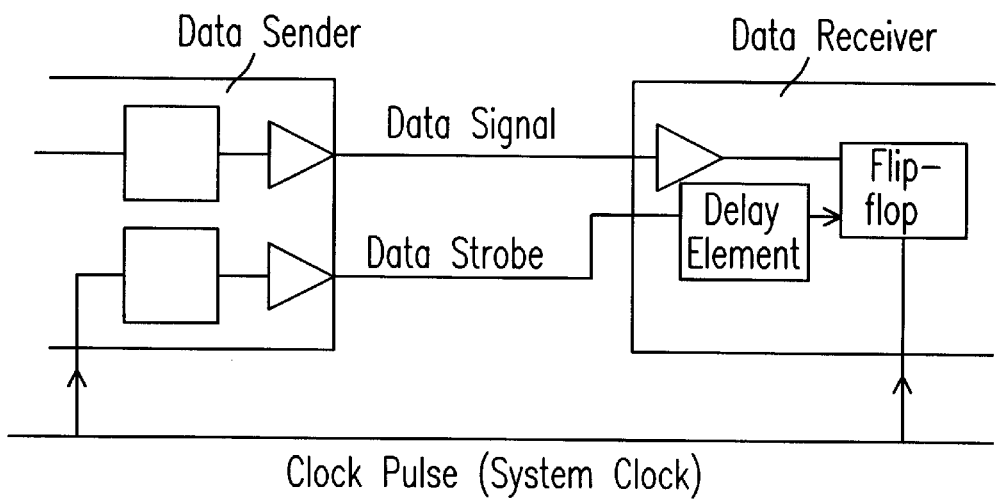
FIG. 6 shows a practical hardware structure for data sender and receiver when operating with data strobe.
Figure 7:
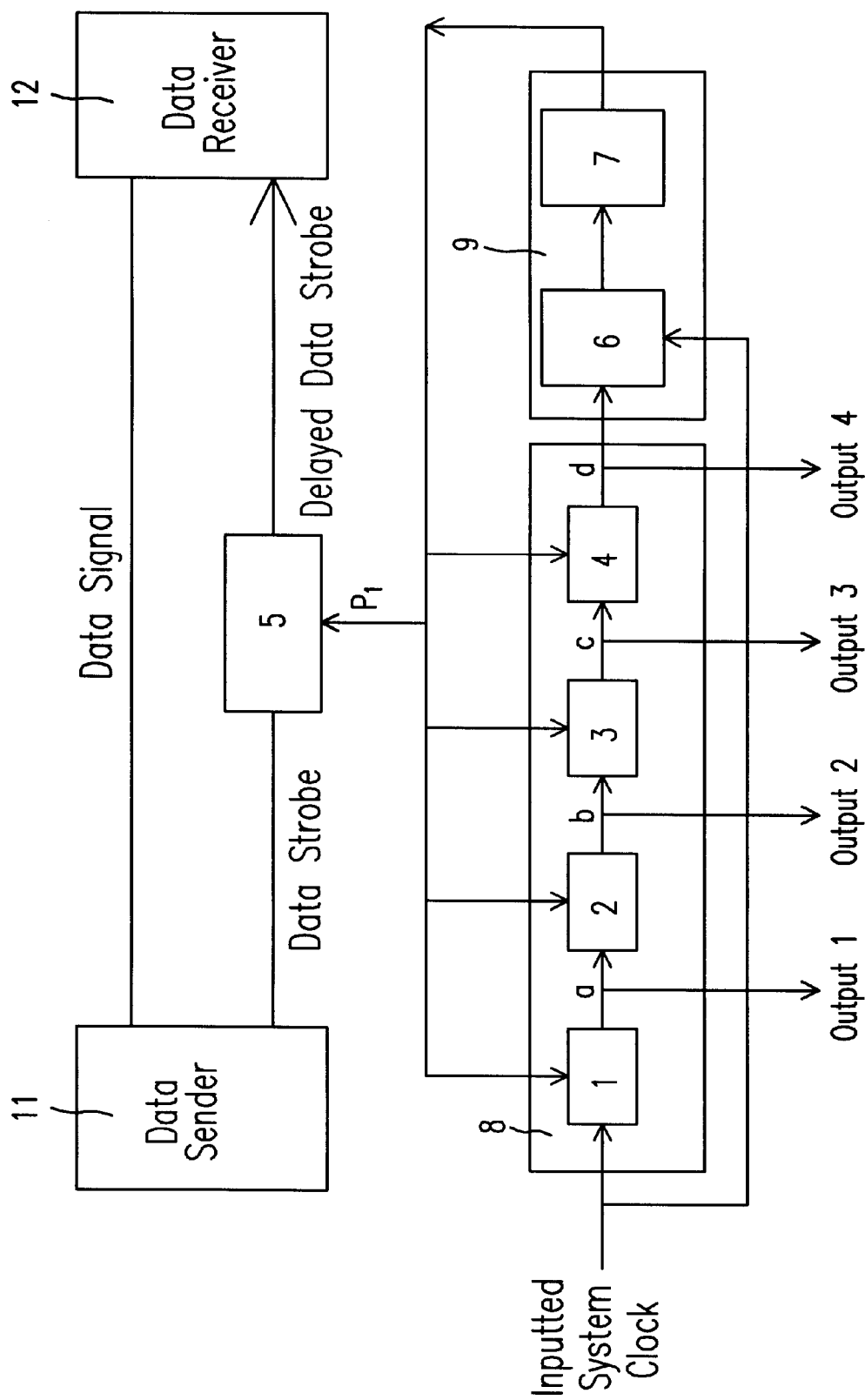
FIG. 7 shows a configuration of all elements used in an embodiment of the present invention.

FIG. 7 shows an embodiment of the present invention as a phase lock circuit for dynamically delaying a data strobe signal which is transmitted, according to a system clock, together with a data signal, from a data sender 11 to a data receiver 12. The phase lock circuit comprises a strobe delay element 5, a delay array 8, and a comparator 9.

The strobe delay element 5 receives data strobe from data sender 11 and delays the data strobe signal for a first delay period according to a control signal outputted from a comparator 9 and inputted to a strobe delay control pin p2 thereof (the delay period produced by the strobe delay element 5 is hereinafter called "first delay period". Its length is determined by the strobe delay element 5 according to the control signal). The delayed data strobe is then sent to data receiver 12.

The delay array 8 is used for delaying the system clock for a second delay period according to the control signal applied to the four delay elements 1, 2, 3, and 4 there in (the delay period produced by the delay array is hereinafter called "second delay period". Its length is determined by the delay array 8 according to the control signal).

The comparator 9 receives the delayed system clock from delay array 8 through point d, and the original system clock applied thereto, and decides the second delay period by analyzing the phase difference between the delayed system clock and the original system clock, to generate, according to the second delay period, the control signal to be applied to both the strobe delay element 5 and delay array 8 (four delay elements 1, 2, 3, and 4 there in), whereby the second delay period or the phase difference, which reflects the influence of the variation of environmental and operational conditions on the delay array consisting of serially connected delay elements each identical to the strobe delay element, can be used to determine what kind of control signal shall be generated to adapt the strobe delay element to the variation of environmental and operational conditions so that the delay of data strobe at receiver is always in such a margin that the data strobe can enable receiver to read data accurately and reliably. It must be noted that the same control signal shall be applied to the delay array as well as the strobe delay element so that the response of both the strobe delay element and delay array to the variation of environmental and operational conditions may keep pace with each other, thereby the strobe delay element can adapt to the variation of environmental and operational conditions based on the control signal which reflects the phase difference indicating the extent the actual first delay period and second delay period differ from a preset value (target delay period, for example).

The above comparator 9 may comprise a phase detector 6 detecting the phase difference (second delay period) between the original system clock applied thereto and the delayed system clock outputted from the delay array through point "d", and a counter 7 generating the control signal according to the phase difference received from phase detector 6.

Obviously the above counter 7 may be configured to generate the control signal according to the difference between a preset value and the detected phase difference (or second delay period ). In other words, counter 7 calculates, according to the phase difference, to what extent the first delay period shall be adjusted, and generates the control signal according to the calculation.

The phase lock circuit is so configured that when the second delay period (or the phase difference) is bigger than the preset value, the control signal is generated in such a way that both the first delay period and the second delay period are reduced respectively by the strobe delay element 5 and the delay array 8 to both of which the control signal are applied, and when the second delay period is smaller than the preset value, both the first delay period and the second delay period are increased respectively by the strobe delay element 5 and the delay array 8 to both of which the control signal are applied.

The above data array 8 comprises a group of serially connected clock delay elements 1, 2, 3, and 4 each delaying the system clock for the first delay period according to the control signal, whereby the second delay period is approximately equal to the sum of all the first delay periods.

Figure 8:
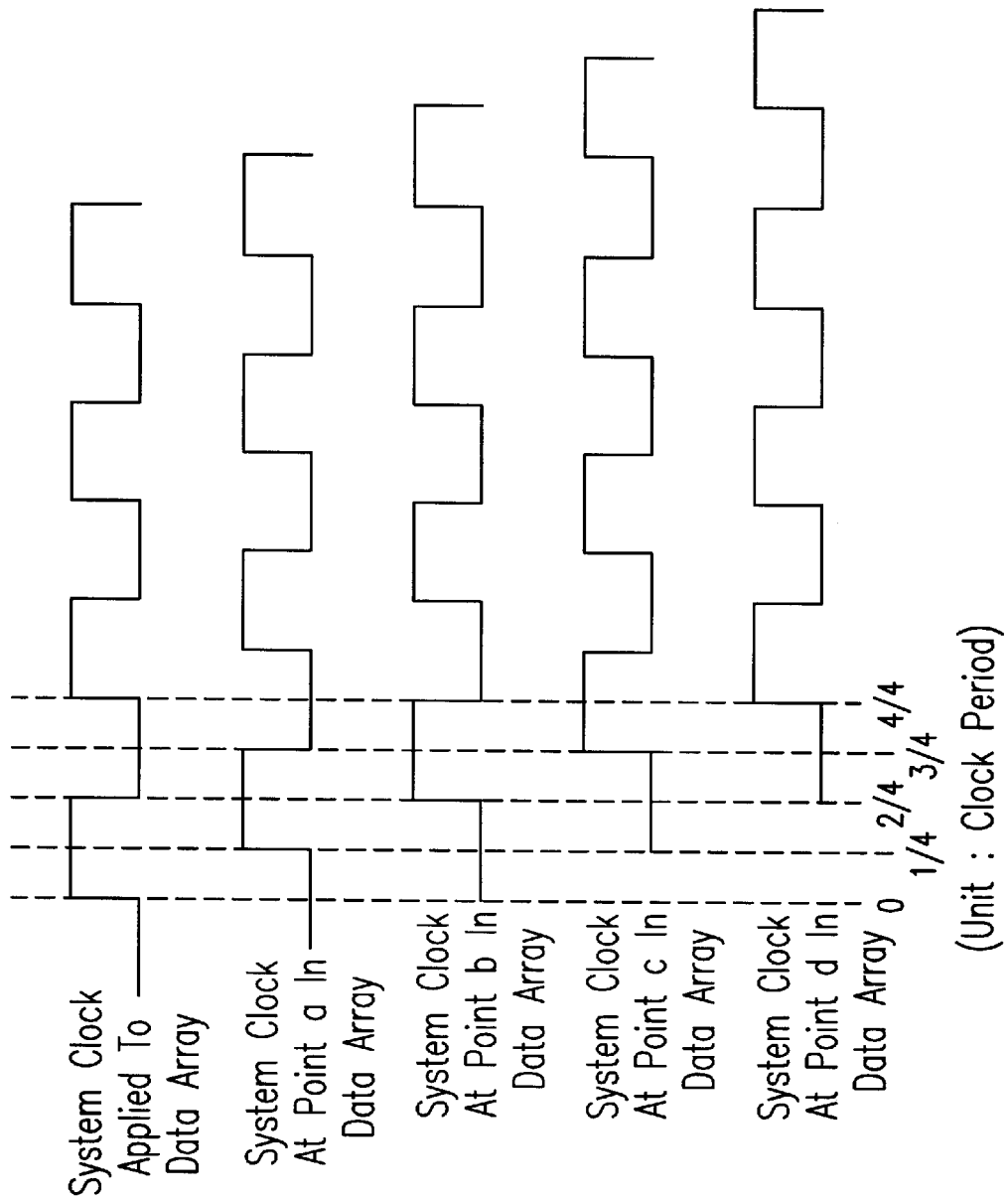
FIG. 8 shows a timing chart of the system clock at various points in the clock delay element shown in FIG. 7.

The number of the serially connected clock delay elements in the above phase lock circuit is selected to be 4 and the target first delay period is set in the range of about ¼ of the clock period of the system clock, so that the second delay period is in the range of about one clock period of the system clock. The delay period of system clock at points a, b, c, and d inside delay array 8 is respectively ¼, 2/4, ¾, and 1 of the total second delay period, as shown in FIG. 8. The delayed system clock has four delay elements which have outputs extending from points a, b, c, and d, respectively, for further applications of the signals to other devices. In case there's an application need of these delay periods, signals may be drawn from Points a, b, c, and d. The reason the number of the serially connected clock delay elements in the above phase lock circuit is selected to be 4 and the target first delay period is set in the range of about ¼ of the clock period of the system clock will be explained in FIG. 11. It shall be noted that, in the example, when the preset value is equal to a clock period of the system clock, and the second delay period is also equal to a clock period of the system clock, the control signal, which is determined according to the difference (0 for this case) between the second delay period and the preset value, shall be at such a level that the strobe delay element is kept to provide a first delay period which is approximately equal to ¼ of clock period of the system clock. If all of the delay elements including the strobe delay element and the serially connected delay elements 1, 2, 3, and 4 are identical, and each contributes the same delay period, the second delay period shall be equal to one clock period in this particular case. Actually the embodiment can be so configured that the control signal is, when the difference between the second delay period and the preset value is in a certain range (or in other words, the second delay period is approximately equal to the preset value), at such a level that the strobe delay element is kept to provide a first delay period which is in such a range (usually the range in which the edge of the data strobe appears in the middle region of the data signal) that the data strobe can enable receiver to do correct and reliable data reading, regardless of the number of the serially connected delay elements in the delay array and the selection of the preset value, or what the exact target first delay period is.

Obviously the number of the serially connected clock delay elements in the above phase lock circuit is not limited to four, the target first delay period is not limited to ¼ of clock period, and the preset value is not limited to a clock period of the system clock, as long as the control signal can be at a level leading to that the strobe delay element is kept to provide a first delay period which is in such a range that the data strobe can enable receiver to do correct and reliable data reading.

Figure 11:
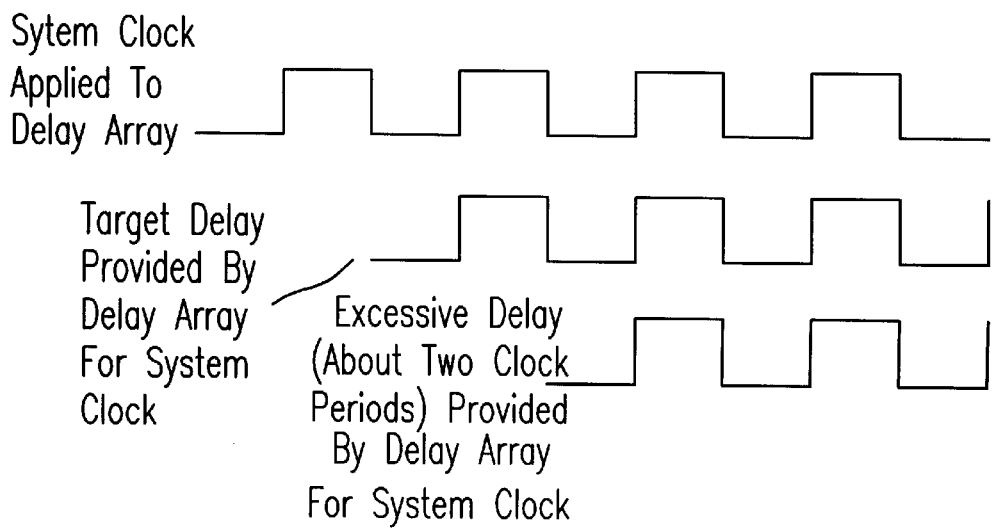
FIG. 11 shows the reason the present invention suggests that the system clock is delayed for a period in a range of about one clock period of the system clock.

The above comparator 9 is further illustrated as follows: detector 6 has an input pin receiving delayed system clock from point d of delay array 8, another input pin receiving original system clock applied thereto, and an output pin providing counter 7 with the information about detected phase difference resulting from comparing the edge (rising edge or falling edge) between the delayed system clock and the original system clock. It must be noted that the phase difference of about 2 (or more than 2) clock periods as shown in FIG. 11 is not easily detected according to this mode of implementation. This is why the embodiment is arranged in such a way that the phase difference is in a range not too much away from one clock period. The present invention, however, is not limited by the range of the phase difference. The operating principles are described as follows.

Figure 9:
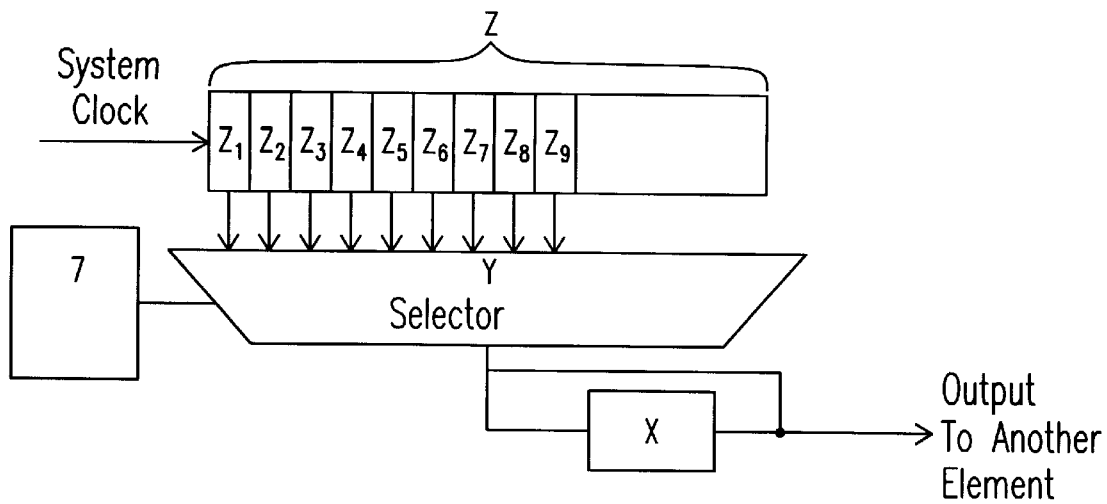
FIG. 9 illustrates the elements shown in FIG. 7.
Figure 10:
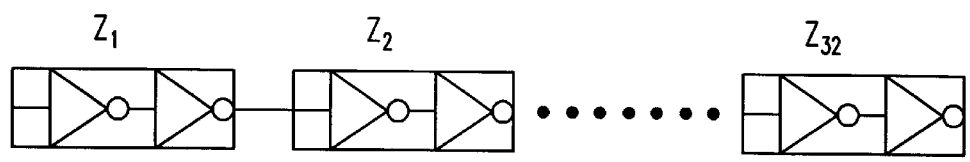
FIG. 10 illustrates Z portion shown in FIG. 9

The elements 1, 2, 3, 4, and 5 in FIG. 7 are identical, and each is based on the structure shown in FIG. 9 where there're 3 types of parts: X, Y, Z respectively providing different range of delay. Part X may be adopted to provide a very large range of delay according to environmental and operational conditions, part Y represents the fixed delay arising from the route (or line) and selector, and part Z consisting many small components $Z1, Z2, \ldots, Zn$ may be used to do minor delay adjustment. System clock applied thereto externally or from the last delay element reaches Z1, after being delayed by Z1, it is simultaneously passed to selector and Z2, after being delayed by Z2, again it is simultaneously passed to selector and Z3, after being delayed by Z3 it is also simultaneously passed to selector and Z4, and so on. Eventually the selector decides the number of Z according to the signal from counter 7. Each small component of Z (such as Z1, or Z2, . . . . ) is illustrated in FIG. 10. Usually Y and Z are used to provide delay and a delay element in such an application provides a delay=Y+qz, where z is the delay each component Z1, or Z2, . . . . can provide, and q ranges from 0 to the MAX number of the components configured in part Z of the delay element (q ranges 0–31 in the example shown in FIG. 9). The delay is equal to 4(Y+qz) for an example in which there are four times of delay. Unless the required delay is too big to be beyond what Y and Z can afford, the mode expressed by px+Y+qz, where p is selected from among 1 and 0, and q ranges from 0 to the MAX number of the components configured in part Z of the delay element (q ranges 0–31 in the example shown in FIG. 9), is usually not necessary. The above configuration is thus adopted so as to avoid too big delay (2 or more clock periods) as that shown in FIG. 11.

The counter 7 in FIG. 7 is used to select the parameters of X and Z (value of p and q in pX+Y+qz) based on the calculation to what extent the strobe delay element or delay array 8 shall be adjusted, whereby a dynamic adjustment according to the detected influence of environment conditions on the strobe delay element and delay array 8 can be achieved. To prevent noise and glitch from interfering the system, gray encoding is suggested for representing the parameters, i.e., numbers 1, 2, 3,4 are respectively encoded as 00, 01, 11, 10.

Figure 12:
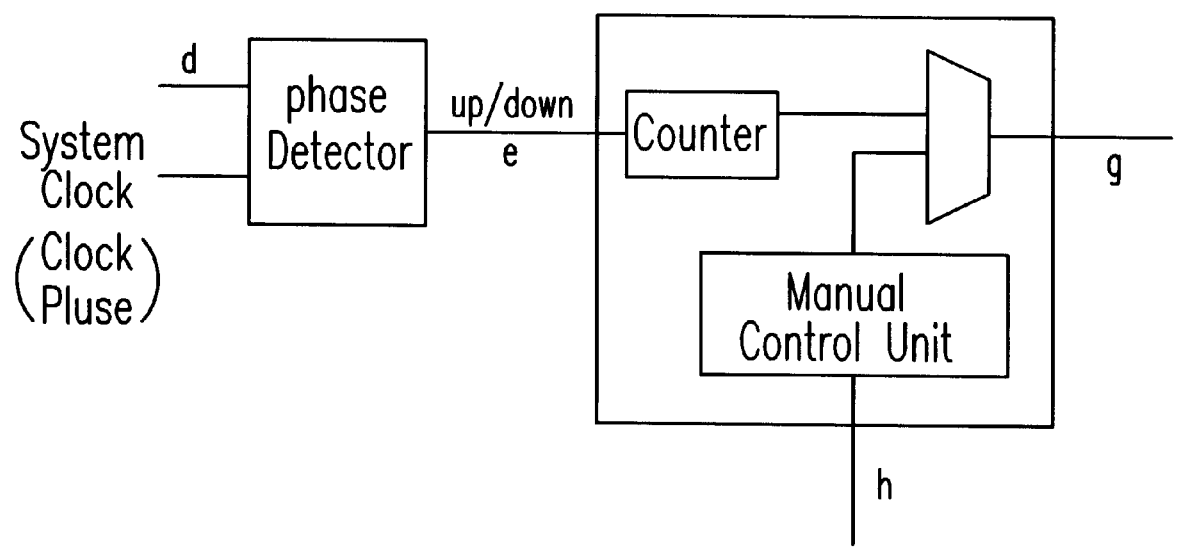
FIG. 12 shows a structure of the counter shown in FIG. 7.

Shown in FIG. 12 is a detailed structure of counter 7 comprising an operating unit and a manual control unit. The manual control unit outputs data g if it receives signal h, otherwise counter 7 receives signal e for calculation and then Outputs calculated g.

It is suggested by the present invention the reference clock (data strobe in the embodiment) is so delayed that its edge appears in the middle region of data signal. This is because data signal is read with the rising or falling of data strobe. That the edge of data strobe appearing in the middle region of data signal can provide an operating margin immune from the influence of uncertain or uncontrollable factors, and thereby assure reliable and accurate data reading. This is why a better embodiment suggested by the present invention has ¼ of clock period delay for data strobe, in order to allow DDR operation (reads data signal with both rising and falling edges of data strobe). ½ of clock period delay, however, is suggested for the operation of reading only a piece of data per clock period of data strobe (one reading per clock period of data strobe).

While the invention has been described in terms of what are presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase lock circuit for dynamically delaying a data strobe signal which is transmitted together with a data signal, according to a system clock, from a data sender to a data receiver, said phase lock circuit comprising:
   a strobe delay element for delaying said data strobe signal for a first delay period responsive to a control signal applied thereto;
   a delay array for delaying said system clock for a second delay period responsive to said control signal applied thereto; and
   a comparator comprising a detector for detecting said second delay period, and a counter responsive to said second delay period for generating said control signal applied to both said strobe delay element and said delay array.

2. The phase lock circuit according to claim 1 wherein said counter is configured for generating said control signal responsive to a difference between a preset value and said second delay period.

3. The phase lock circuit according to claim 2 wherein when said second delay period is bigger than said preset value, both said first delay period and said second delay period are reduced according to said control signal.

4. The phase lock circuit according to claim 2 wherein when said second delay period is smaller than said preset value, both said first delay period and said second delay period are increased according to said control signal.

5. The phase lock circuit according to claim 2 wherein said delay array comprises a group of serially connected clock delay elements each of said delay elements being configured to delay said system clock for a fraction of said second delay period responsive to said control signal applied thereto, whereby said second delay period is substantially equal to the sum of all of said first delay periods caused by said serially connected clock delay elements.

6. The phase lock circuit according to claim 5 wherein the number of said serially connected clock delay elements is selected in such a way that said second delay period is, when said preset value is equal to a clock period of said system clock, approximately equal to said clock period of said system clock.

7. The phase lock circuit according to claim 5 wherein each of said serially connected clock delay elements delays said system clock in the same way as that said strobe delay element delays said data strobe signal.

8. The phase lock circuit according to claim 5 wherein the number of said serially connected clock delay elements is four, and said first delay period is, when said preset value is equal to said clock period of said system clock, approximately equal to one quarter of said clock period.

9. The phase lock circuit according to claim 1 being installed beside said receiver.

10. The phase lock circuit according to claim 1 wherein when said second delay period is approximately equal to a preset value, said first delay period is in such a margin that said data strobe signal enables said data receiver to always read said data signal correctly.

11. A phase lock method for dynamically delaying a signal by using a data strobe delay element with a digitally adjustable delay period, a data strobe signal which is transmitted together with a data signal responsive to a system clock, said transmission being from a data sender to a data receiver, said phase lock method comprising the steps of:
   adjusting said data strobe delay element to delay said data strobe signal for a first delay period;
   obtaining a delayed system clock signal by repetitively delaying and using an auxiliary delay element, said system clock being delayed N time each for said first delay period;
   detecting a clock difference between said delayed system clock and said system clock;
   adjusting said data strobe delay element responsive to said clock difference being bigger than a preset value in order to delay said data strobe signal for a second delay period which is shorter than said first delay period, and adjusting said auxiliary delay element to repetitively delay said system clock N times each for said second delay period; and
   adjusting said data strobe delay element responsive to said clock difference being smaller than said preset value to delay said data strobe signal for a third delay period which is longer than said first delay period, and adjusting said auxiliary delay element to repetitively delay said system clock N times each for said third delay period.

12. The phase lock method according to claim 11 wherein said delayed system clock is obtained by repetitively delaying, using an auxiliary delay element which is identical to said data strobe delay element, said system clock N times each for said first delay period;

13. The phase lock method according to claim 11 wherein said data strobe delay element is adjusted to delay said data strobe signal for said first delay period of approximately one quarter of a clock period of said system clock, said preset value is selected to equal said clock period, and said N is selected to be four.

14. The phase lock method according to claim 11 wherein said data strobe delay element is adjusted to delay said data strobe signal for said first delay period of approximately half of a clock period of said system clock, said preset value is equal to said clock period, and said N is two.

15. The phase lock method according to claim 11 wherein when said clock difference is approximately equal to said preset value, said first delay period is in such a margin that said data strobe signal enables said data receiver to always read said data signal correctly.

16. A phase lock circuit for dynamically delaying a data strobe signal which is transmitted together with a data signal in response to a system clock, said transmission being from a data sender to a data receiver, said phase lock circuit comprising:

a strobe delay element for delaying said data strobe signal for a first delay period responsive to a control signal applied thereto;

a delay array for delaying said system clock for a second delay period responsive to said control signal applied thereto; and a comparator comprising a detector for detecting said second delay period, and a counter responsive to a difference between said second delay period and a preset value for generating said control signal to be applied to both said strobe delay element and said delay array.

17. The phase lock circuit according to claim 16 wherein said delay array comprises a group of serially connected clock delay elements, each of said elements being configured to delay said system clock for a fraction of said second delay period responsive to said control signal applied thereto, whereby said second delay period is substantially equal to the sum of all said first delay periods caused by said serially connected clock delay elements.

* * * * *